United States Patent [19]

Patalong et al.

[11] Patent Number: 4,626,703
[45] Date of Patent: Dec. 2, 1986

[54] THYRISTOR WITH CONNECTIBLE CURRENT SOURCES AND METHOD FOR OPERATING SAME

[75] Inventors: Hubert Patalong, Munich; Eberhard Spenke, Pretzfeld, both of Fed. Rep. of Germany

[73] Assignee: Siemens Aktiengesellschaft, Berlin & Munich, Fed. Rep. of Germany

[21] Appl. No.: 501,112

[22] Filed: Jun. 6, 1983

[30] Foreign Application Priority Data

Aug. 18, 1982 [DE] Fed. Rep. of Germany ....... 3230721

[51] Int. Cl.⁴ .......................................... H03K 17/72
[52] U.S. Cl. ........................... 307/252 G; 307/252 C; 307/252 D; 307/305; 357/38
[58] Field of Search .......... 307/252 C, 252 D, 252 G, 307/305; 357/38, 38 G

[56] References Cited

U.S. PATENT DOCUMENTS 3,307,049  2/1967  von Bernuth et al. ......... 307/252 G
3,959,668  5/1976  Ohhinata et al. ............... 307/252 G
4,058,741  11/1977  Tokunaga et al. .................. 307/305
4,239,985  12/1980  Ohhinata .............................. 307/305

Primary Examiner—J. Zazworsky
Attorney, Agent, or Firm—Hill, Van Santen, Steadman & Simpson

[57] ABSTRACT

A thyristor has a semiconductor body exhibiting an n-p-n-p layer sequence with the small n-emitter and the p-emitter being contacted by first and second electrodes. The p-base layer has a third electrode connected to the first electrode through a first current source connectible with a first polarity. For triggering or quenching the thyristor as quickly and efficiently as possible, the n-base layer has a fourth electrode connected to the second electrode through a second connectible current source, the second current source being connectible to the fourth electrode with a second polarity opposite the first polarity.

3 Claims, 6 Drawing Figures

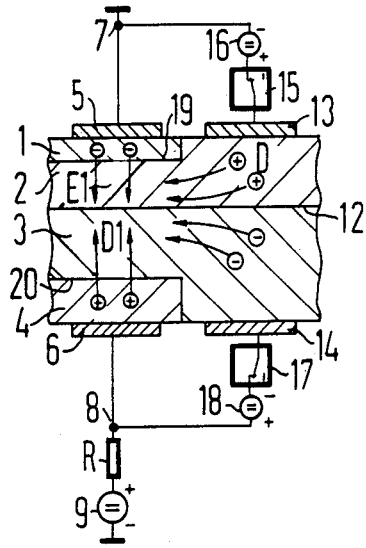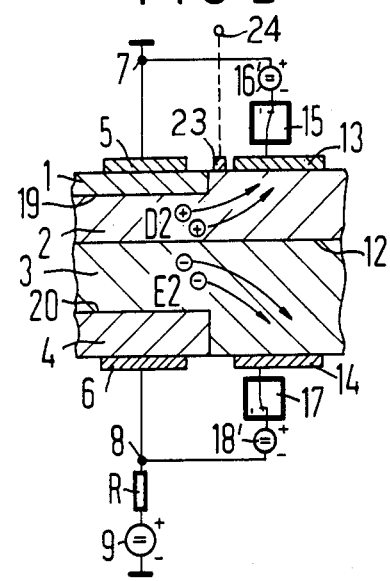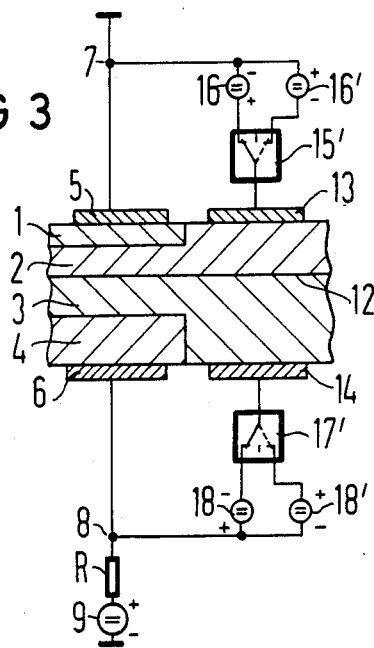

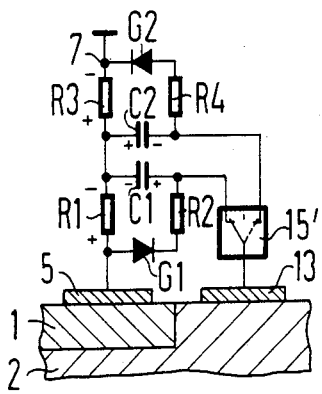
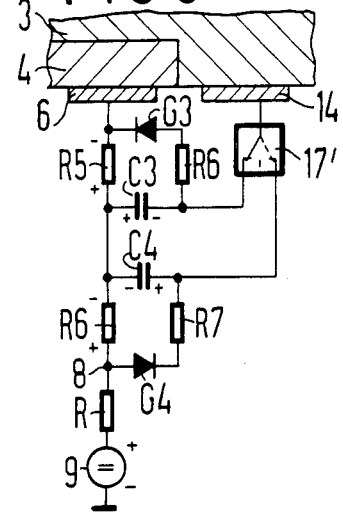
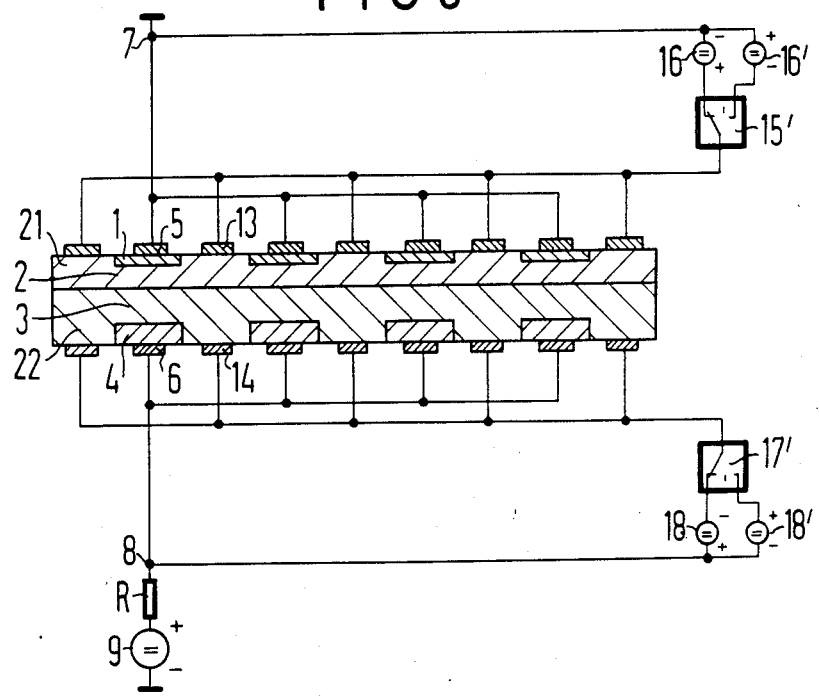

THYRISTOR WITH CONNECTIBLE CURRENT SOURCES AND METHOD FOR OPERATING SAME

BACKGROUND OF THE INVENTION

FIELD OF THE INVENTION

The present invention relates to a thyristor having current sources of opposite polarity connectible thereto, and to a method for operating such a thyristor.

Of the several pn-junctions of a conventional thyristor, only the central pn-junction separating the two base layers from one another is polarized in the non-conducting direction in the inhibited or non-conducting state of the thyristor, such that substantially the entire voltage across that junction is removed. The positive holes are thereby displaced from that portion of the p-base adjacent to the central pn-junction. At the same time, the negative electrons are displaced from the adjacent portion of the n-base. The immobile acceptors and donors of the doping material thus produce a space charge zone at the central pn-junction. The voltage at the respective pn-junctions between the emitters and the adjacent base layers decrease by a negligible amount, so that no emission can occur into the base layers from the emitters.

When electrons from the n-emitter and holes from the p-emitter are injected into the respectively adjacent base layers, these continue to dissipate the space charge zone. The inhibiting effect of the central pn-junction is dissipated to the same degree. As a result, the voltages at the remaining pn-junctions decrease by a substantially larger amount and intensify the emission of the emitters. Finally, the injected charge carriers, in the form of a quasi-neutral plasma, flood the two base layers and the central pn-junction. The voltages at all of the pn-junctions do not noticeably change thereafter; the thyristor is fully triggered and now conducts a load current which is essentially determined by an external circuit (load circuit) and the load resistor therein.

If the external circuit is an ac circuit the thyristor is quenched at the next successive zero axis crossing of the pending voltage. If the external circuit is a dc circuit, or when the thyristor in an ac circuit is to be quenched before the zero axis crossing is reached, the inhibited condition must be reintroduced; this being accomplished by eliminating the electron/hole plasma flooding the central pn-junction.

SUMMARY OF THE INVENTION

It is an object of the present invention to provide a thyristor having successive alternating layers of opposite conductivity type which can be quickly and effectively triggered or quenched.

The above object is inventively achieved in a thyristor having an n-emitter with a first electrode and contacting an adjacent p-base layer, and having a p-emitter with a second electrode and contacting an adjacent n-base layer, the base layers being separated from one another by a pn-junction, and wherein the p-base layer has a third electrode connected to the first electrode through a first current source connectible with a first polarity and the n-base layer has a fourth electrode connected to the second electrode through a second connectible current source which is connectible with a polarity opposite the polarity of the first current source.

At least one advantage achieved with the thyristor (and operating method) disclosed and claimed herein is that if the thyristor is in an inhibited state, two injection current sources become effective by means of connecting the first and second current sources to the third and fourth electrodes, the one injection current source injecting holes and the other injecting electrons into the two base layers. The charge carriers injected by the two current sources cause two simultaneous and complementary events by means of which the space charge zone at the central pn-junction is extremely rapidly and effectively filled with charge carriers, so that the thyristor is reliably triggered. Moreover, the electron/hole plasma flooding of the central pn-junction in the conducting state of the thyristor is "drawn out" of the thyristor in an effective manner by means of connecting two current sources having polarities for functioning as extraction current sources to the third and fourth electrodes, so that the thryristor is quickly quenched.

The appropriate electrodes of the thyristor may be connected to the respective current sources through a switch which is either open or closed, or in a further embodiment the electrodes may each be connectible to one of two current sources having opposite polarity by means of a change over switch.

DESCRIPTION OF THE DRAWINGS

FIG. 1 is a sectional view and circuit schematic diagram of a first embodiment of a thyristor constructed in accordance with the principles of the present invention.

FIG. 2 is a sectional view with a circuit schematic diagram of a second embodiment of a thyristor constructed in accordance with the principles of the present invention.

FIG. 3 is a sectional view with a schematic circuit diagram of a third embodiment of a thyristor constructed in accordance with the principles of the present invention.

FIG. 4 is a circuit diagram showing a technical realization of a portion of the circuit shown in FIG. 3.

FIG. 5 is a circuit diagram showing a technical realization of another portion of the circuit shown in FIG. 3.

FIG. 6 is a sectional view with a schematic circuit diagram of a fourth embodiment of a series of thyristors on a single substrate constructed in accordance with the principles of the present invention.

DESCRIPTION OF THE PREFERRED EMBODIMENTS

A thyristor constructed in accordance with the principles of the present invention having a semiconductor body consisting of doped semiconductor material such as, for example, silicon is shown in FIG. 1. The thyristor exhibits four successive layers of alternating conductivity type, those layers being an n-emitter layer 1, a p-base layer 2, an n-base layer 3, and a p-emitter layer 4. The n-emitter 1 has a cathode-side electrode 5 and the p-emitter 4 has an anode-side electrode 6. The electrodes 5 and 6 consist of electrically conductive material such as, for example, aluminum. The electrode 5 is connected to ground through a terminal 7. The electrode 6 is connected to one terminal of a voltage source 9 through a terminal 8 and a load resistor R. The other terminal of the voltage source 9 is at ground.

A central pn-junction 12 is formed at the boundary between the base layers 2 and 3. Another pn-junction 19 is formed between the p-base 2 and the n-emitter 1, and another pn-junction 20 is formed between the n-base 3 and the p-emitter 4.

The p-base 2 has an electrode 13 and the n-base 3 has an electrode 14, each consisting of an electrically conductive material such as, for example, aluminum. The electrode 13 is connected through a switch 15 and a current source 16 to the terminal 7 of the cathode-side electrode 5. The electrode 14 is connected through a switch 17 and a current source 18 to the terminal 8 of the anode-side electrode 6. The current sources 16 and 18 exhibit respective polarities such that, in the illustrated position of the switches 15 and 17, they positively bias the electrode 13 in comparison to the cathode-side electrode 5, and negatively bias the electrode 14 in comparison to the anode-side electrode 6.

In the inhibited condition of the thyristor, the anode terminal 8 is connected to positive potential so that the pn-junction 12 between the p-base 2 and the n-base 3 is polarized in a non-conducting direction such that substantially the entire voltage across the terminals 7 and 8 drops out at that junction. In contrast thereto, only negligible portions of the voltages at the pn-junctions 19 and 20 drop out, so that no emission from the emitters 1 and 4 into the base layers 2 and 3 occurs. A space charge zone exists at those portions of the p-base 2 and the n-base 3 adjacent the pn-junction 12. The switches 15 and 17 thereby disconnect the current sources 16 and 18 from the electrodes 13 and 14.

When the switches 15 and 17 are placed in the position illustrated in FIG. 1, electrons E1 are injected from the n-emitter 1 into the p-base 2. Simultaneously, holes D1 are injected from the p-emitter 4 into the n-base 3. The inhibiting effect of the pn-junction 12 is thus reduced to an increasing degree so that correspondingly increasingly larger portions of the voltage across the terminals 7 and 8 drop out at the pn-junctions 19 and 20 and thus emission from the emitters is maintained and intensified. The electrons E1 ejected from the n-emitter 1 into the p-base 2, and the holes D1 injected from the p-emitter 4 into the n-base 3, form an electron/hole plasma which floods the base layers 2 and 3. The thyristor is thus fully ignited and in its conductive state. The thyristor is quenched, for example, by interrupting the external circuit connected at terminals 7 and 8 or, if the voltage source 9 is an ac voltage source, is automatically quenched when the next following zero axis crossing of the voltage accross the terminals 7 and 8 occurs. The switches 15 and 17 are opened again after ignition of the thyristor so that the current sources 16 and 17 are shut off.

A second embodiment of the thyristor disclosed and claimed herein is shown in FIG. 2, wherein current sources 16' and 18' are utilized which have respective polarities opposite to those of the current sources 16 and 18 in the embodiment of FIG. 1. All other components are identically referenced.

The thyristor shown in FIG. 2 is triggered in the conventional manner such as, for example, by supplying a positive gate trigger current to a terminal 24 having an electrode 23 contacting a portion of the p-base 2. In the conducting state of the thyristor, the switches 15 and 17 are in switching positions (not illustrated) whereby the current sources 16' and 18' are disconnected. When the thyristor is to be quenched, the current sources 16' and 18' are connected through the switches 15 and 17 (now in the positions shown in FIG. 2) to the electrodes 13 and 14. This causes the electron/hole plasma flooding of the pn-junction 12 and the base layers 2 and 3 to be extracted in a particularly rapid and effective manner from the base layers 2 and 3. The electrons E2 of the plasma proceed to the electrode 14 and the holes D2 of the plasma proceed to the electrode 13. To the same degree by which the charge carrier concentration in the plasma is reduced, the plasma loses its conductivity, the resistance of the thyristor increases, the load current through the terminals 7 and 8 decreases, the voltage drop across the load resistor R decreases, and the voltage of the voltage source 9 is assumed to an increasing degree by the thyristor structure (layers 1 through 4) and finally is assumed by the space charge zone at both sides of the pn-junction 12. The thyristor is then in an inhibited or non-conducting state. As shown in FIG. 2, quenching of the thyristor is achieved without interrupting the circuit connected at the terminals 7 and 8 or without compensation of the voltage source 9.

A further embodiment of a thyristor in accordance with the principles disclosed and claimed herein is shown in FIG. 3, wherein the electrode 13 is selectively connectible through a change over means 15' to the positive pole of a current source 16 or to the negative pole of a current source 16', the other poles of the current sources 16 and 16' being connected to the terminal 7. Similarly, the electrode 14 is selectively connectible through a change over means 17' to the negative pole of a current source 18 or to the positive pole of a current source 18', the current sources 18 and 18' having other poles respectively connected to the terminal 8. When the thyristor shown in FIG. 3 is in an inhibited state, it is triggered by actuation of the change over means 15' and 17' which cause those devices to move from their respective center switch positions to the switch positions shown in solid lines in FIG. 3. The trigger events then occur in the sequence already described in connection with FIG. 1. In the conductive state of the thyristor, the change over means 15' and 17' are returned to their center switch positions so that the current sources 16, 16', 18 and 18' are disconnected from the electrodes 13 and 14. In order to quench the thyristor, the change over means 15' and 17' are brought to the switching positions illustrated in FIG. 3 in dashed lines, the quenching events then occurring in the sequence already described in connection with FIG. 2.

A circuit-technical design for the basic circuit shown in FIG. 3 is illustrated in FIG. 4. As shown in FIG. 4, the current source 16 is simulated by a capacitor C1 connected to the change over means 15', and a resistor R1 interconnected between the terminal 7 and the electrode 5. The other side of the capacitor C1 is connected to that side of the resistor R1 which is away from the electrode 5 (closest to the terminal 7). A rectifier G1 is connected in parallel to the series connection of R1 and C1, and a current limiting resistor R2 is connected in series to the rectifier G1. The current source 16' is simulated by a capacitor C2 connected to the change over means 15' and a resistor R3. The resistor R3 is interconnected between the terminal 5 and the electrode 7, and the capacitor C2 is connected to that side of the resistor R3 away from the terminal 7 (and closest to the electrode 5). A rectifier G2 is connected in parallel to the series connection of R3 and C2, and a current limiting resistor R4 is connected in series with the rectifier G2.

In the conducting state of the thyristor, voltage drops respectively occur across the resistors R1 and R2, the respective polarities of those voltage drops being indicated in FIG. 4. The capacitors C1 and C2 are charged with voltages over the rectifiers G1 and G2, the polarities of those voltages being also indicated. The terminal of C1 connected to the change over means 15' is positively biased in comparison to its terminal connected to R1, whereas the terminal of C2 connected to the switch 15' is negatively biased in comparison to its terminal connected to R3.

Another circuit-technical design for another portion of the circuit shown in FIG. 3 is illustrated in FIG. 5. As shown in FIG. 5, the current source 18 is simulated by a capacitor C3 connected to the change over means 17' and a resistor R5. The resistor R5 is interconnected between the electrode 6 and the terminal 8, with the capacitor C3 being connected to that side of the resisitor R5 away from the electrode 6. A rectifier G3 is connected in parallel to the series connection of R5 and C3, and a current limiting resistor R6 is connected in series with the rectifier G3. The current source 18' in FIG. 3 is simulated by a capacitor C4 which is connected to the change over means 17' and a resistor R6. The resistor R6 is interconnected between the electrode 6 and the terminal 8 with the capacitor C4 being connected to that side of the resistor R6 away from the terminal 8 (closest to the electrode 6). A rectifier G4 is connected in praallel to the series connection of R6 and C4, and a current limiting resistor R7 is connected in series with a rectifier G4. The manner of operation of the circuit shown in FIG. 5 corresponds to that of the sub-circuit shown in FIG. 4.

A semiconductor arrangement is shown in FIG. 6 wherein a plurality of thyristors of the type illustrated in FIG. 3 is integrated on a shared semiconductor body. One of these thyristors is provided with the same reference numerals as is in FIG. 3. The electrodes 5, 6, 13 and 14 are for the referenced thyristor. A semiconductor arrangement is achieved in which the respective strip-shaped thyristor layers (layers 1–4) and pn-junctions, which are respectively provided with a third electrode (for example electrode 13) and a fourth electrode (for example electrode 14) disposed opposite one another, alternate with each other. For symmetry, a further pn structure referenced at 21 and 22 can be provided to the left of the thyristor structure consisting of the layers 1, 2, 3 and 4.

Although modifications may be suggested by those skilled in the art it is the intention of the inventors to embody within the patent warranted hereon all changes and modifications as reasonably and properly come within the scope of their contribution to the art.

We claim as out invention:

1. A thyristor comprising:
   a semiconductor body having an n-emitter with a first electrode, a p-base layer adjacent to and contacting said n-emitter, a p-emitter having a second electrode, and an n-base layer adjacent to and contacting same p-emitter, said p-base layer and said n-base layers being separated by a pn-junction, and said p-base layer having a third electrode and said n-base layer having a fourth electrode;
   two current sources comprising a first current source pair connected to said first electrode and a first switching means for connecting one of said current sources in said first current source pair at a time to said third electrode with a first polarity;
   two further current sources comprising a second current source pair connected to said second electrode and a second switching means for connecting said fourth electrode to one of said current sources in said second current source pair at a time with a second polarity opposite to said first polarity;
   each of said current sources in the first current source pair being opposite polarity and having a resistor, a capacitor interconnected in series between said resistor and said third electrode, and a rectifier connected in parallel with the series connection of said capacitor and said resistor, said resistors in the respective current sources in said first current source pair being connected in series between said first electrode and an external terminal; and
   each of said further current sources in the second current source pair being of opposite polarity and having a further resistor, a further capacitor interconnected in series between said further resistor and said fourth electrode, and a further rectifier connected in parallel with the series connection of said further capacitor and said further resistor, said further resistors in the respective further current sources in said second current source pair being connected in series between said second electrode and another external terminal.

2. A thyristor as claimed in claim 1 wherein each of said current sources further comprises a current limiting resistor connected in series with said rectifier.

3. A thyristor as claimed in claim 1 wherein said thyristor is integrated on said semiconductor body with a plurality of additional identically constructed thyristors with said third and fourth electrodes of the respective thyristors being disposed on opposite boundary surfaces of said semiconductor body, such that said first and third electrodes alternate on one side of said semiconductor body and said second and fourth electrodes alternate on an opposite side of said semiconductor body.

* * * * *